(12) United States Patent
Ferguson

(10) Patent No.: US 7,561,088 B1
(45) Date of Patent: Jul. 14, 2009

(54) MULTI-LOOP DATA WEIGHTED AVERAGING IN A DELTA-SIGMA DAC

(75) Inventor: Paul C. Ferguson, Riverton, UT (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 12/104,369

(22) Filed: Apr. 16, 2008

(51) Int. Cl.
     H03M 1/66 (2006.01)
(52) U.S. Cl. ................................ 341/144; 341/143
(58) Field of Classification Search .......... 341/140–160
     See application file for complete search history.

(56) References Cited

U.S. PATENT DOCUMENTS

| | | | | |
|---|---|---|---|---|
| 6,864,819 | B2* | 3/2005 | Wang | 341/144 |
| 7,030,798 | B2* | 4/2006 | Wang | 341/144 |
| 7,095,350 | B2* | 8/2006 | Hagiwara et al. | 341/143 |
| 7,098,828 | B2* | 8/2006 | San et al. | 341/143 |
| 7,227,482 | B2* | 6/2007 | San et al. | 341/143 |
| 7,324,032 | B2* | 1/2008 | Kim | 341/144 |
| 7,486,210 | B1* | 2/2009 | Hong et al. | 341/60 |
| 2005/0116851 | A1 | 6/2005 | Clara et al. | |

OTHER PUBLICATIONS

Beis, Uwe: "An Introduction to Delta Sigma Converters" Retrieved from the Web on Aug. 30, 2007, URL: http://www.beis.de/Elektronik/DeltaSigma/DeltaSigma.html; last updated Aug. 2007; 14 pages.
Liu, Mingliang: "Tutorial on Designing Delta-Sigma Modulators: Parts 1 and 2" CommsDesign Mar. 30, 2004; Retrieved from the Web on Aug. 30, 2007 URL: http://www.commsdesign.com/article/printableArticle.jhtml?articleID=18402743, 18 pages.
Westcott, Tim: "Sigma-Delta Techniques Extend DAC Resolution", Embedded Systems Design—Embedded.com (Jun. 23, 2004); Retrieved from the Web on Aug. 30, 2007, URL: http://www.embedded.com/columns/technicalinsights/22101730?printable=true 5 pages.

* cited by examiner

*Primary Examiner*—Lam T Mai
(74) *Attorney, Agent, or Firm*—Blakely Sokoloff Taylor & Zafman, LLP

(57) ABSTRACT

Methods and apparatuses enable generating an analog representation of an M-bit digital input. A DAC system receives the M-bit data word and generates a control signal to control the output elements of a DAC to output an analog representation of the input data word. The DAC includes two data weighted averaging (DWA) loops, each one having $2^M$ bits to control corresponding groups of $2^M$ output elements. The control signal includes a number of bits equal to the number of output elements, with a number of one bits equal to the number of output elements to activate to represent the input data word. Half of the number of ones are triggered by one of the DWA loops, and the other half are triggered by the other DWA loop. One of the loops may include a constant offset in addition to the variable number of ones that represents the input data word.

21 Claims, 9 Drawing Sheets

MULTI-LOOP DATA WEIGHTED
AVERAGING IN A DELTA-SIGMA DAC

FIELD

Embodiments of the invention relate to digital-to-analog converters (DACs), and more particularly to data weighted averaging in a DAC.

BACKGROUND

Moderately high speed operation in a digital-to-analog converter (DAC) is often achieved by the use of a multi-bit delta-sigma architecture. Device mismatch in a multi-bit DAC results in output linearity distortion. This distortion may be reduced by the use of a dynamic element matching scheme such as provided by a data weighted averaging algorithm. The prevailing view is that the so-called data weighted averaging (DWA) algorithm provides the best performance in such systems. The DWA algorithm reduces the effects of non-linearities by changing which output elements in a DAC are switched on and off, as described in more detail below. However, as system designs become increasingly larger with greater numbers of bits used to achieve high linearity with a low oversampling rate, these system designs can push the limits of the DWA algorithm. Such system designs are increasingly common in DACs employed in communication equipment. The increased size of the designs is accompanied by nonlinearity due to large amounts of switching energy in the DAC. More specific details are set forth below.

FIG. 1A is a prior art representation of non-data weighted averaging and data weighted averaging control signals to switch DAC output elements for a given input data word. Data word input 110 represents the numeric value of the input word. There are four separate input data words, 3, 1, 5, 4 (all in decimal), represented as a sequence to be output according to two separate conventions, as represented in two separate sets of DAC output elements (OEs), 124 and 134. DAC OEs 124 are controlled by control signal 122 of thermometer decoder 120, which does not employ a DWA algorithm, while DAC OEs 134 are controlled by control signal 132 of dynamic element matching controller (DEM) 130, which employs a DWA algorithm. The input data word for FIG. 1A would be represented by three bits (or M=3), in binary format as 011, 001, 101, and 100. Each box of DAC OEs 124 and 134 represents a single output element of the M-bit DAC, as controlled by a corresponding bit in control signals 122 and 132. As shown, there are 7 unit elements corresponding to the number of bits, M=3.

Shaded boxes indicate an output element that is activated during a sample period. White boxes indicate an output element that is deactivated during a sample period. Alternately, in a differential DAC, shaded boxes indicate output elements coupled to the positive output of the DAC, and white boxes indicate elements coupled to the negative output of the DAC. During the first input, there are three output elements activated according to the input value of three. During the second period there is one output element activated, and so forth. With thermometer decoding without DWA, the output elements are always triggered from the left-most output element to the right. Thus, the left-most output elements are continually triggered to produce an output, while the right-most output elements are triggered less frequently. In a perfectly matched system without process variation or mismatch, switching the same output elements (i.e., the left-most output elements) on and off for each subsequent input would result in consistent performance of the DAC. However, as will be readily appreciated by one skilled in the art, variations in processing integrated circuits (ICs) are unavoidable, and design tolerances actually allow for variance. To achieve the "average" performance expectation provided by the processing variation tolerances, DAC system designers recognize that it is desirable to switch different ones of the output elements, which is the purpose behind the DWA algorithm.

DAC OEs 134 represent the activation sequence for a DAC controlled by a DEM 130 employing a DWA algorithm. The basic principle of the DWA algorithm is to track which output elements are switched on during a first sample, and then switch on output elements representing the output value starting with the first unused output element of the previous sample. For example, as shown, during the first sample the three left-most output elements are activated. During the second sample, the first three output elements are deactivated, and the first unused output element of the previous sample (the fourth) is turned on. During the third sample, the fourth output element is turned off, and five different output elements are turned on starting with the fifth. To activate five different output elements during the third sample period, it is necessary to wrap around to the beginning of the group of output elements, activating the first two output elements. This wrapping behavior is the source of the usage of the term 'DWA loop.' During the fourth sample four output elements are activated beginning with the third output element. The DWA algorithm performs an averaging function and causes each output element to be activated approximately as frequently as each other output element. This creates first order noise shaping such that the distortion due to mismatch is transformed into higher-frequency signals that fall outside the signal band. However, the DWA algorithm performs less than ideally as the number of bits is increased.

FIG. 1B is a prior art representation of a data weighted averaging control signal to switch DAC output elements for an input data word having low numeric values. Consider data word input 140 (input values 1, 1, 2, 2), which generates a sequence of DAC outputs for which the transient energy scales with DAC output code, which is that the transient energy will increase linearly with increases in the illustrated input value. Data input word 140 is received by DEM 150, which employs a DWA algorithm to produce control signal 152 to control the DAC OEs 154. Assume that the input is held constant at a binary value of 001, in accordance with the first two input words. At the changing of the clock, one output element is turned off and a different output element is turned on, as shown in DAC OEs 154. Any transient effect due to the deactivation and/or activation of an output element is triggered one time, and in a multiple of one. If the input is then held constant at a binary value of 010, the changing of the clock triggers two output elements to be turned off and two different output elements to be turned on. Any transient effect due to the deactivation and/or activation of an output element is therefore triggered in two output elements, and is present in a multiple of two. Transient energy scales for all inputs as long as the value of the input is half or less than half of the total number or output elements available in the DAC, such that the amount of the transient behavior is in the same multiple as the number of the input. Thus, the behavior of the DAC under the DWA algorithm is linear for input values that require less than half of the total output elements.

FIG. 1C is a prior art representation of a data weighted averaging control signal to switch DAC output elements for an input data word having high numeric values. Note that as used herein, "high" numeric values refers to high relative to the output capability of a DAC on which the output will be produced, and will generally be understood to refer to an input that is larger than one half of the available output elements 174. Thus, consider data word input 160, which has input values of 5, 5, 6, 6. The input words are received at DEM 170, which employs a DWA algorithm to generate control signal 172, which in turn controls DAC OEs 174. With numeric values greater than midscale, the transient energy does not scale with code, but rather decreases with increasing code. Assume that the input is held constant at a binary value of 101, or a decimal value of 5. At the instant of the changing of the clock, only two output elements are deactivated and hence available to be activated on a subsequent sample. Therefore two output elements will be deactivated and two different output elements will be activated. Any transient effect due to the deactivation and/or activation of an output element is therefore present in a multiple of two. Similarly, during such time that the input is held constant at a binary value of 110 (decimal value of 6), at the changing of the clock only one element is currently deactivated and hence available to be activated on a subsequent sample. Therefore one output element will be deactivated and a single different output element will be activated. Any transient effect due to the deactivation and/or activation of an output element is therefore present in a multiple of one. Because the activation sequence is not a consistent multiple of the input code for the whole range of input codes, the sequence causes the generation of a nonlinear output signal. In particular, any time two consecutive inputs whose sum is greater than M, the total number of components in the DAC, there will be a nonlinear component in the output signal. Note that any of DAC OEs 124, 134, 154, and 174 could be the same or different DAC OEs.

FIG. 2A is a representation of a time versus output graph illustrating the output step and transition overshoot of a prior art DAC system. The act of switching the output elements on and off may introduce non-linearity due to transient effects during the activation and/or deactivation of one or more DAC output elements. The switching events can generate more distortion as the sampling frequency rises, given that the switching events will represent a greater portion of the total energy in any DAC output sample. Such transient-based distortion is commonly referred to as "inter-symbol interference" (ISI) because the shape of the next output depends on the value of the previous output.

The graph of FIG. 2A represents an output step 210 for a sequence of input data words constituting a "ramp." The ramp is a series of inputs whose initial input is zero, and whose value is incremented by one at each interval until the highest possible value is reached, at which time the ramp is concluded. The output of an ideal DAC in response to an input ramp appears as a perfect stair step waveform. However, as shown the non-ideal DAC controlled by a DWA signal produces a transient effect in the form of a transition overshoot 220. Transition overshoot 220 represents a curve illustrating the overshoot of the DAC for the individual input values. Specifically, the amount of overshoot for each input value is arbitrarily depicted to be one-half of the output quantity of the unit element. Therefore if the output amplitude of the unit element is designated to be "one LSB" (least significant bit), then the amount of overshoot is depicted to be "½ LSB." Observe that the overshoot in the middle of the ramp is much larger than the overshoot at the top or the bottom, as seen on transition overshoot curve 220, which is seen to be more parabolic than linear. Such a transfer characteristic is known to create harmonic distortion, a majority of which is contained in the second harmonic, which places additional strain on an output filter that receives and processes the DAC output signal to be able to provide a "clean" output signal. Note that the ramp input is not the only cause of the distortion illustrated in FIG. 2A. Rather, the nonlinearity occurs on any occasion in which two adjacent samples have a combined value whose value is greater than the total number of output elements in the DAC.

FIG. 2B is a representation of a time versus output graph illustrating the output step and transition overshoot of a prior art DAC system employing $2*2^M$ output elements. Output step 230 as a function of time for a ramp input to a DAC having $2*2^M$ output elements is shown. The ramp input is a series of inputs whose initial input is zero, and whose value is incremented by one at each interval until the highest possible value is reached, at which time the ramp is concluded. Note that output step 230 is linear. Note also that transition overshoot 240 increases throughout the DAC output with time, but is also linear. Contrast the linearity of transition overshoot curve 240 with the nonlinear transition overshoot 220 represented in FIG. 2A. Transition overshoot 240 at each step is linearly related to the size of the step. Thus, the overall linearity of the DAC is greatly enhanced by using $2*2^M$ output elements The linearly increasing transition overshoot 240 has the drawback that signals operating around the higher output range of the DAC will have much more overshoot energy than signals operating in the lower output range.

SUMMARY

Methods and apparatuses enable generating an analog representation of an M-bit digital input. A digital-to-analog conversion/converter (DAC) system receives the M-bit data word and generates a control signal to control (activate and deactivate) the output elements of a DAC to output an analog representation of the input data word. The DAC includes two data weighted averaging (DWA) loops, each one having $2^M$ output elements. The control signal for the DAC includes a sequence of bits that represents which output elements should be activated and deactivated, with a number of one bits equal to the number of output elements to activate to represent the input data word. Half of the number of ones is activated by one of the DWA loops, and the other half is activated by the other DWA loop. In one embodiment, one of the loops includes a constant offset in addition to the variable number of ones that represents the input data word. In one embodiment, an odd bit for an odd-valued input data word is always provided to the same DWA loop or control signal. In another embodiment, an allocation algorithm can be employed that provides a different distribution of the odd bit (e.g., a round robin). The dual-DWA control as described herein provides linearity in the output step of the DAC as well as the transition overshoot of the output. Thus, transition noise is pushed to higher harmonics, which allows more efficient filtering and improved performance over traditional methods.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1A:
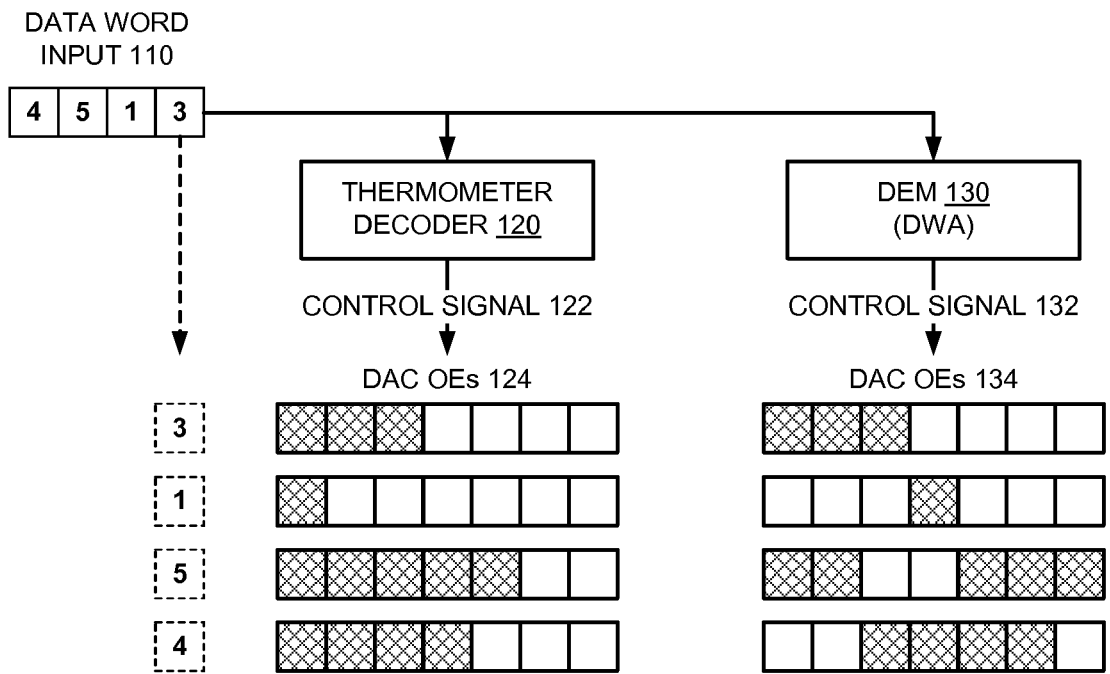
FIG. 1A is a representation of prior art non-data weighted averaging and data weighted averaging control signals to switch DAC output elements for a given input data word.
Figure 1B:
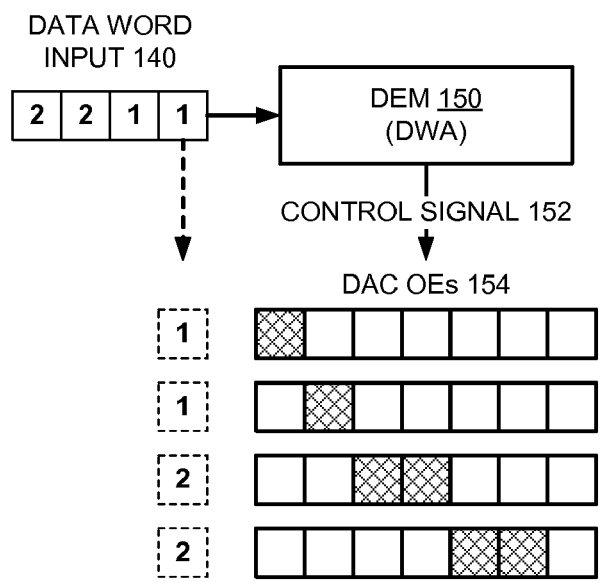
FIG. 1B is a representation of a prior art data weighted averaging control signal to switch DAC output elements for an input data word having low numeric values.
Figure 1C:
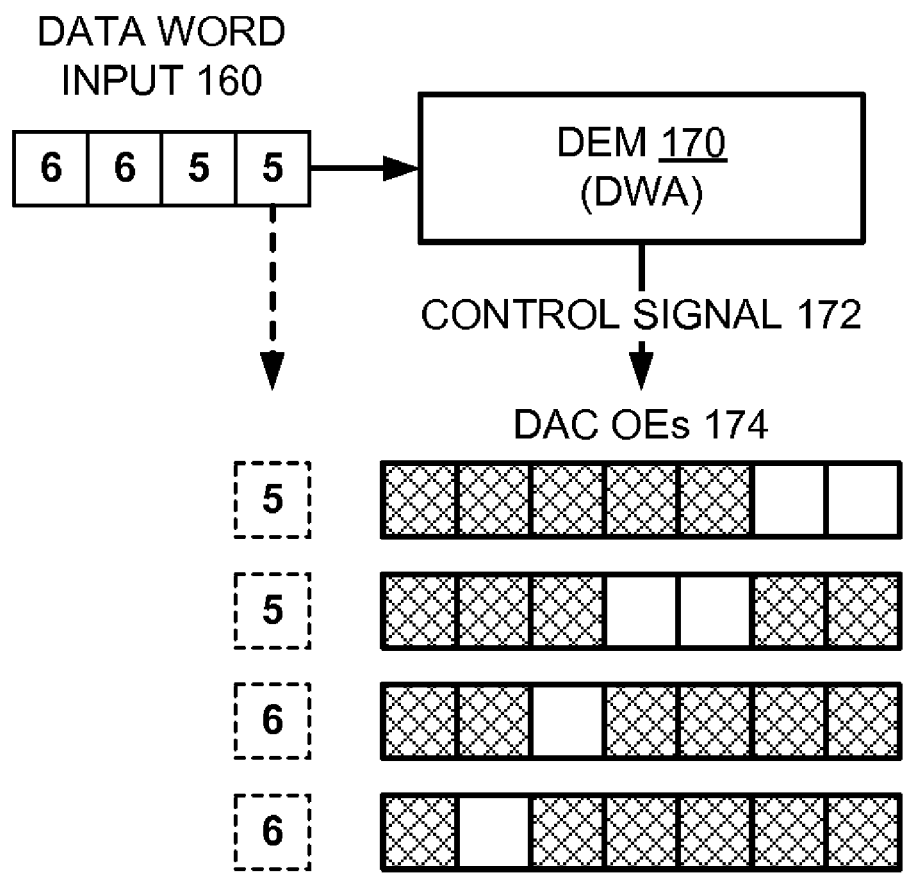
FIG. 1C is a representation of a prior art data weighted averaging control signal to switch DAC output elements for an input data word having high numeric values.
Figure 2A:
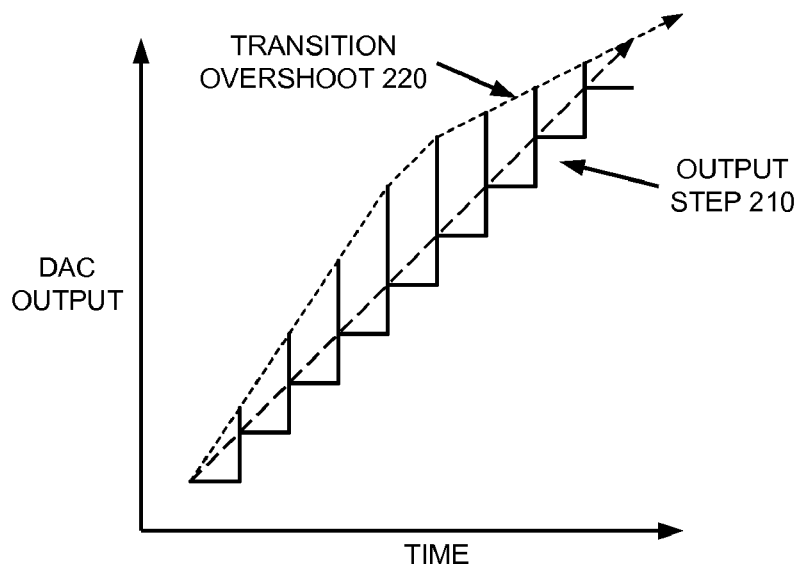
FIG. 2A is a representation of a time versus output graph illustrating the output step and transition overshoot of a prior art DAC system employing DWA.
Figure 2B:
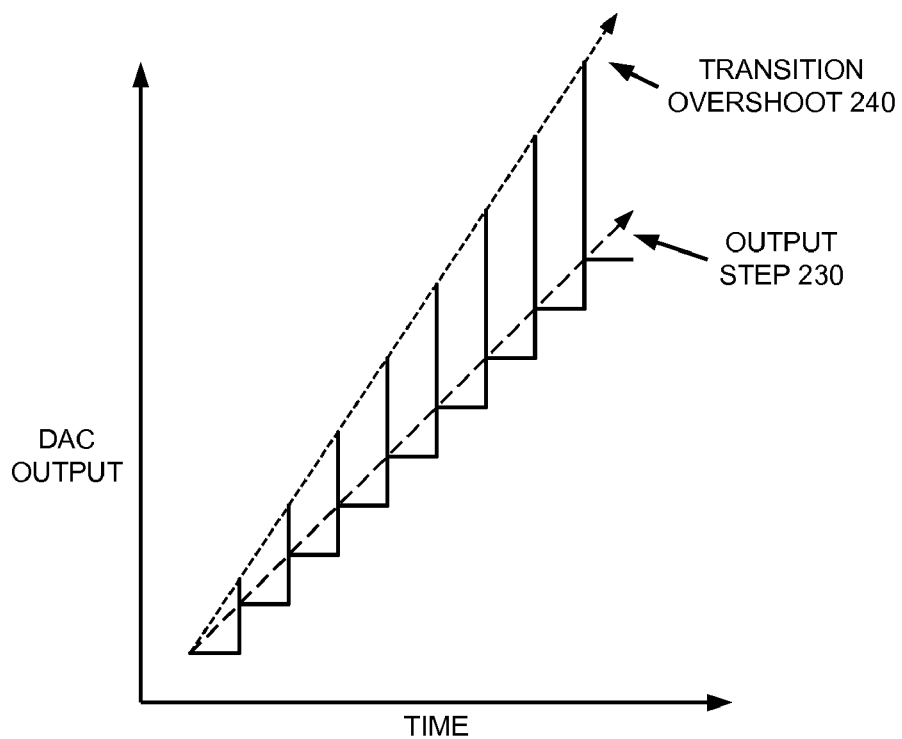
FIG. 2B is a representation of a time versus output graph illustrating the output step and transition overshoot of a prior art DAC system employing $2*2^M$ output elements.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Methods and apparatuses enable a linear output from a digital-to-analog converter (DAC) via a multi-data weighted averaging (DWA) technique. The multi-DWA technique requires some increase in DAC hardware over traditional approaches, but simplifies the requirements of an analog output filter coupled to the DAC. In one embodiment, the multi-DWA technique described herein provides a single DAC with each output element controlled by a flip-flop. The flip-flops form a structure similar to a first-in, first-out (FIFO) buffer. In one embodiment, this buffer is then logically separated into multiple (e.g., two) portions, each portion being designated a DWA loop or a smaller FIFO. In other embodiments, the loop may be divided into any arbitrary number of loops. The resulting DAC does not require the complicated logic and timing as previous approaches, such as that provided in U.S. Patent Application Publication No. 2005/0116851 of Clara et al., for U.S. patent application Ser. No. 10/971,570. Rather, as described herein, a DAC controlled according to the described multi-DWA technique provides direct current (DC) balance and a true differential path not found in many approaches, and without the complexity of previous approaches.

When an input number is received, the Dynamic Element Matching block determines which unit elements to activate and sets the corresponding output bits accordingly. In one embodiment, in which the DEM block consists of two DWA loops, or FIFOs, half of the bits are activated in one loop, and half are activated in the other loop. In addition to these bits, a constant number of bits is activated in one of the loops. It will be shown that this technique makes it so that the number of bits switching in the DAC is nearly independent of the input number. A DAC employing the dual DWA technique as described herein is fully balanced to provide improved performance over known single DWA techniques as discussed above. Each of the equal-sized DWA loops has a normal DWA function independent of the other.

In the general case of multiple DWA loops, each DWA loop controls a portion of the output elements of the DAC. Generally, the number of output elements controlled per DWA loop will be equal, and the number of DWA loops would be even. That is, there may be two DWA loops each controlling half the output elements, four DWA loops each controlling a quarter of the output elements, six DWA loops each controlling one-sixth the output elements, etc. The use of odd numbers of DWA loops would require additional logic to determine how to divide the output elements among the odd number of DWA loops. However, knowing that such an implementation would require such logic to determine how to allocate the control signals among the odd number of DWA loops, the implementation would be within the capability of one skilled in the art.

Similarly, the DWA loops need not each control an equal number of output elements, although such implementations provide for simpler control logic. If DWA loops were to control an unequal number of output elements, the system designer would need to generate a heuristic algorithm for allocation of one bits among the various DWA loops sufficient to output the numeric value of the input data word. One example of how bits could be allocated among more than two DWA loops is to allocate bits of the numeric output value one or two at a time among the DWA loops in a round-robin fashion. Bits would be separated among the DWA loops one or two at a time until all bits in the output have been allocated to control loops. On the next input, allocation of bits would begin where allocation was left off for the previous sample. Then bits allocated to the various loops would be allocated within each DWA in a similar fashion, where allocation begins where the previous allocation of bits left off in a previous sample where the DWA loop controlled one or more output elements to output a one. Other allocation of bits among multiple DWA loops can be used.

The examples herein focus on two DWA loops for simplicity of explanation and not by way of limitation, where each loop controls half the output elements of the DAC. Thus, the technique may be referred to in one embodiment as a dual DWA technique. It will be understood that a multi-DWA technique as described above is not limited to application with two DWA loops. Each DWA loop contains $2^M$ elements, and each loop provides control to half of the output elements of the DAC, which each provide approximately half of the output current for an output signal corresponding to the input data word. Although the DWA loops are independent, they are also coordinated so that the total output of the DAC corresponds to the value of the input data word.

Note that inputs may be even or odd. When the input data word is odd, there will be an odd bit that must be apportioned between the two DWA control loops. In one embodiment, a dynamic element matching (DEM) component employs a determination algorithm to determine where to place the extra bit among the two DWA control loops. Alternatively, such logic in the DEM can be hard-coded to provide a consistent result, and always allocate the extra bit to a given DWA control loop. In one embodiment, the outputs of the two DWA control loops as a function of the input data word are described by the equations below. As used in the equations below, the outputs (e.g., OUTPUT1, OUTPUT2) represent the control signals generated by the DWA control loops. The control signals in turn activate and deactivate output elements of the DAC. Thus, DACOUT represents the output produced by the DAC in response to the control signals generated by the two DWA control loops. In the equations, the ceiling function rounds the argument up to the nearest integer, and the floor function rounds the argument down to the nearest integer:

$$\text{OUTPUT1} = \text{floor}(\text{INPUT}/2) \tag{1}$$

$$\text{OUTPUT2} = (2^{\wedge}M)/2 + \text{ceiling}(\text{INPUT}/2) \tag{2}$$

$$\text{DACOUT} = \text{OUTPUT1} + \text{OUTPUT2} \tag{3}$$

Note that equation (2) describing OUTPUT2 illustrates an embodiment where OUTPUT2 has an offset of $(2^{\wedge}M)/2$ regardless of the input. Also observe that for any even input, ceiling(INPUT/2) and floor(INPUT/2) are equal, resulting in OUTPUT1 being related to OUTPUT2 as OUTPUT2= $(2^{\wedge}M)/2$+OUTPUT1. For any odd input, ceiling(INPUT/2) is one greater than floor(INPUT/2), resulting in the odd input bit being included in the control signal OUTPUT2, which triggers an additional output element controlled by OUTPUT2 to output the bit. As used herein, "triggering" refers to a control signal activating an output element, or causing an output element to "turn on." In one embodiment, the odd input bit may be included in OUTPUT1 instead of OUTPUT2. For example, in a DAC implementation where all DAC output elements may be used to output a maximum input value (i.e., the DAC does not have a redundant output element), the odd input bit should be included in the control signal having the floor function, to prevent losing the extra bit or the odd input bit if the output is already at its maximum.

As an example, consider M=3. As mentioned above, each DWA loop has $2^M$ bits, resulting in a total of $2^{M+1}=2^4=16$, corresponding to 16 output elements (e.g., current sources) in the DAC. Also, $2^M/2=8/2=4$, corresponding to INPUT=4 being the middle input value where the differential output should be zero. When INPUT=4, OUTPUT1=2 and OUTPUT2=6. The total output DACOUT=8. Thus, the DAC will have 8 output elements activated (e.g., current sources diverted to the positive output), and 8 output elements deactivated (e.g., current sources coupled to the negative output), there is no differential output voltage.

If the subsequent sample remains INPUT=4, two output elements in the group of OEs controlled by the first DWA loop will switch off (deactivate), and two different ones will switch on (activate). In the group of OEs controlled by the second DWA loop, only two sources are available to activate, so two sources deactivate and two activate. Thus in the DAC as a whole, there are four total sources that are activated. This is illustrated in more detail below in FIGS. 5 and 8.

Regarding the transient behavior for a dynamic input, it can be shown that the number of output elements switching (changing state) is approximately equal to (INPUT1−INPUT2+$2^{\wedge}M$)/2, where INPUT1 and INPUT2 are adjacent samples. They are approximately equal because there is an even/odd characteristic as in the static case. Neglecting the even/odd characteristic, the behavior of the DAC is linear with a small high-frequency aberration that is outside of the signal band. The small aberration is typically not an issue because of an analog output filter that removes the frequencies that would be affected.

Note that the dual-loop DWA technique described herein can be applied to single-ended or differential circuits, and in current-mode or voltage-mode circuits. The technique is compatible with calibration methods.

Figure 3:
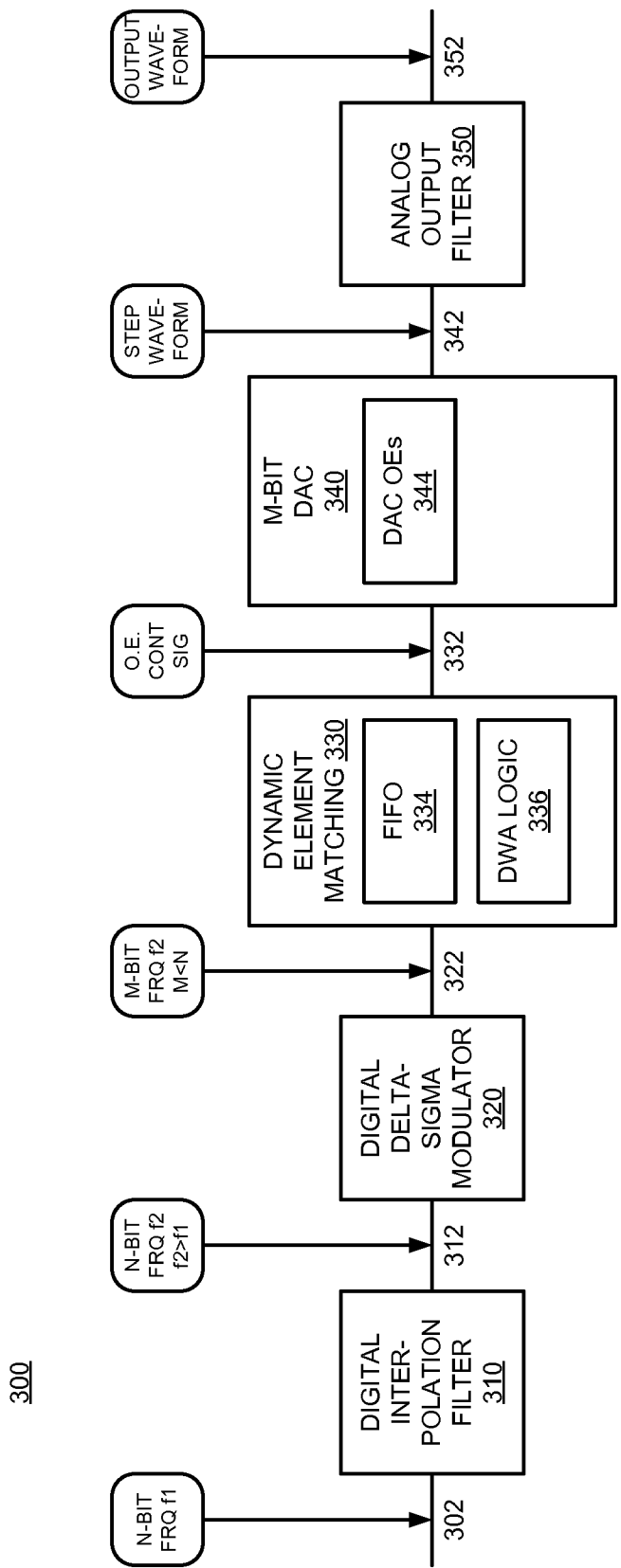
FIG. 3 is a block diagram of an embodiment of a prior art DAC output system.

FIG. 3 is a block diagram of an embodiment of a prior art DAC output system. System 300 represents a delta-sigma DAC system. Blocks 310, 320, 330, 340, and 350 represent functional blocks of the system. The references 302, 312, 322, 332, and 342 represent versions of an input signal as it is propagated through system 300, with signal 342 representing a DAC output signal. Output signal 352 represents a filtered analog output signal generated from input signal 302, which output signal 352 may be a single-ended or differential analog signal, and is the final output signal of system 300.

Input signal 302 represents a sample of a signal of interest for which an analog output will be generated. Signal 302 has N-bits of information (based on the sampling circuitry) and a frequency of f1, corresponding to the sampling rate (i.e., a sample is taken every 1/f1 seconds, assuming f1 has units of Hz). For purposes of discussion, consider signal 302 to be a high resolution digital input data signal, which may have 14, 16, or even more bits of data. Digital interpolation filter 310 creates an interpolation signal 312 from the input signal 302. Interpolation filter 310 processes input signal 302 to generate interpolation signal 312 as a function of input signal 302. Interpolation signal 312 has the same number (N) of bits per sample as input signal 302, but interpolation filter 310 generates interpolation signal 312 with a higher frequency (f2>f1, where f2/f1 is the oversampling rate) than input signal 302.

Digital delta-sigma ($\Delta$-$\Sigma$) modulator 320 performs $\Delta$-$\Sigma$ modulation, which is well known to those skilled in the art.

Dynamic element matching (DEM) module 330 includes functional/logical elements FIFO 334 and DWA logic 336. FIFO 334 represents a FIFO buffer that provides control signal 332 that triggers DAC output elements 344 of DAC 340. DWA logic 336 represents logic to produce a control signal in the FIFO buffer in accordance with a conventional DWA algorithm, which controls the output elements of DAC 340.

DEM 330 generates control signal 332, which represents an output element control signal (OE cont sig). The number of bits in control signal 332 corresponds to the number of bits in DAC 340 (i.e., $2^M$ bits for an M-bit DAC). DAC 340 is a high-speed, low-resolution DAC that is part of the $\Delta$-$\Sigma$ DAC system 300 and may at times be referred to as a quantizer in the literature of the trade. DAC 340 includes DAC OEs 344, which represent the output elements that generate the output analog signal.

DAC 340 generates output signal 342, which is a quantized analog waveform (specifically a step waveform for a ramp input). Output signal 342 may represent a voltage waveform or a current waveform, depending on the specific nature of DAC 340, and may be single-ended or differential. Output signal 342 is received at analog output filter 350, which processes output signal 342 and produces a smooth analog filtered output signal 352. Filtered output signal 352 represents the output waveform produced by system 300. The output filter reduces a large portion of the high frequency quantization noise that is generated by the previous elements of system 300.

Figure 4:
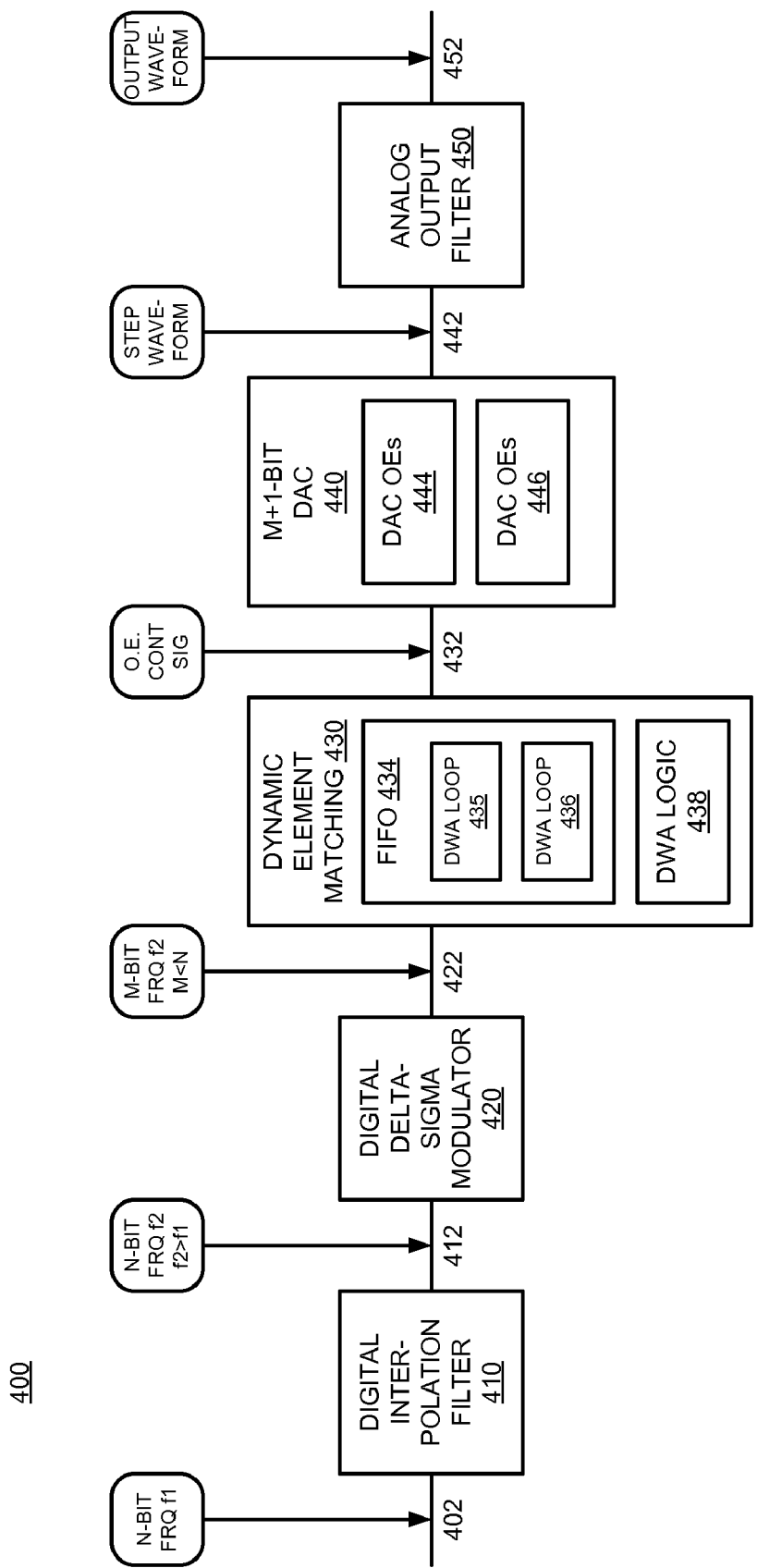
FIG. 4 is a block diagram of an embodiment of a system that generates and uses a dual data weighted averaging DAC control signal.

FIG. 4 is a block diagram of an embodiment of a system that generates and uses a modified data weighted averaging DAC control signal. Dual DWA system 400 is similar to FIG. 3, but with changes in DEM 430 and DAC 440 that are different over corresponding components DEM 330 and DAC 340 of FIG. 3. Each of the functional blocks 410, 420, 430, 440, and 450 perform similar functions to corresponding blocks of FIG. 3. The description of corresponding blocks in FIG. 3 applies equally well to those blocks of FIG. 4, and thus, the discussion of dual DWA system 400 focuses primarily on the improvements over system 300.

Input signal 402 is processed by digital interpolation filter 410 to create interpolation signal 412 for the input signal. As used herein, process or processing refer to any form of digital or analog manipulation of an input. Interpolation signal 412 is processed by digital delta-sigma modulator 420 to provide M-bit modulated signal 422.

Dynamic element matching (DEM) module 430 includes logical/functional elements FIFO 434 and DWA logic 438. FIFO 434 represents an array of flip-flops for the DAC control signal(s) (432) that trigger output elements 444 and 446 of DAC 440. FIFO 434 includes DWA loop 435 and DWA loop 436, which represent logical splits of the array. DWA loops 435 and 436 are DWA control loops that provide control to cause DAC 440 to activate or deactivate its output elements. A logical split of the flip-flop array refers to a single physical FIFO 434 controlled as separate DWA loops 435 and 436. Alternatively to logically separating a single FIFO, separate FIFOs could be used to implement the separate DWA loops. In one embodiment, FIFO 434 is a single physical buffer (e.g., a set of registers) with multiple logical buffers (e.g., one for each of DWA loops 435 and 436) separated by distinct control signals. Note that the logic for FIFO 434 may also be the same as a standard, single FIFO, with the operational logic or code controlling the operation of the FIFO being different. Thus, the operational logic of DEM 430 represented by DWA logic 438 will cause the control logic of FIFO 434 to control bits on certain parts of the FIFO, such as through providing two input controls and offsetting the second signal and adding it to the first signal. DWA logic 438 represents the operational logic that provides the control signals to FIFO 434 and determines how to control the output elements of DAC 440.

DEM module 430 generates control signal 432, which represents one or more output element control signals (OE cont sig). The number of bits in control signal 432 will correspond to the number of elements in DAC 440, and may be $2^M-1$ bits or more, for example, $2*2^M$ bits. Thus, DAC 440 is an (M+1)-bit DAC (referring to a DAC having $2^{M+1}$ elements), having the standard $2^M$ elements, plus $2^M$ additional or redundant output elements (i.e., $2^M$ more elements than technically necessary to produce an output signal corresponding to the highest input value). The redundant output elements allow DAC 440 to provide a more linear output. DAC 440 includes two groups of output elements, DAC OEs 444 and 446. It will be appreciated that DAC OEs 444 and 446 may be logical separations of a single physical DAC, or may be separate physical DACs (e.g., have separate control circuitry) with a combined output.

DAC 440 generates output signal 442, which is received and filtered by analog output filter 450. Analog output filter 450 in turn processes output signal 442, removing high frequency distortion and producing a smooth analog filtered output signal 452.

Figure 5:
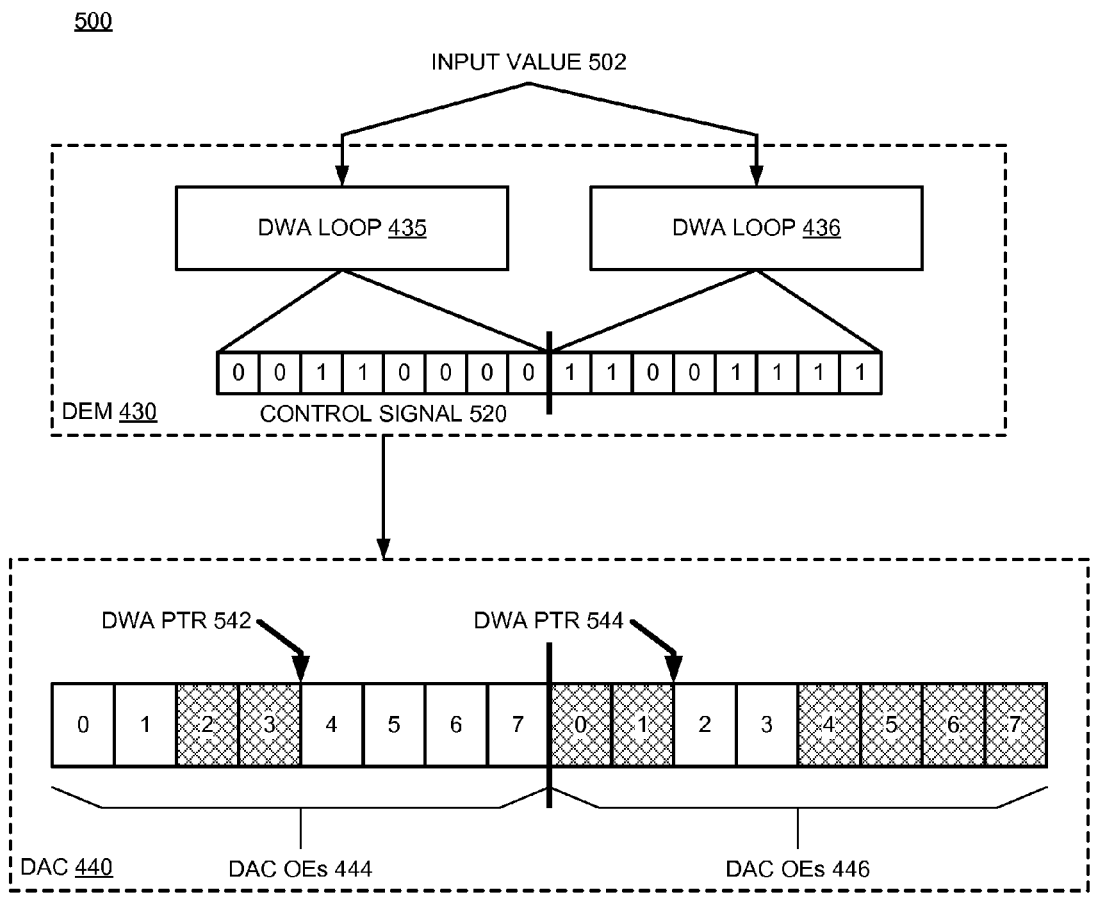
FIG. 5 is a symbolic representation of an embodiment of a dual data weighted averaging DAC system.

FIG. 5 is a symbolic representation of an embodiment of a dual data weighted averaging DAC system. Input value 502 represents a processed input value sample of a signal of interest in a DAC system, and is comparable to signal 422 of FIG. 4. Input value 502 is generally received from a digital delta-sigma modulator. Consider FIG. 4 for details. Input value 502 is received at DEM 430, which will generate control signal 520 to control DAC OEs 444 and 446 of DAC 440. A signal representing input value 502 is received and processed by DEM 430, in accordance with a dual-DWA control algorithm to produce control signal 520.

Although control signal 520 may be stored as a single value in one embodiment in a single register, the upper portion of the control signal can be logically controlled separately from the lower portion of the control signal. That is, the upper portion of the register is controlled independently from the lower portion of the register, and the two portions provide a single control signal. Thus, each portion of control signal 520 may be generated by a separate DWA loop, as represented by DWA loop 435 and DWA loop 436. As described herein, control signal 520 is divided into two equal halves, where each half is a DWA loop intended to control one of the M-bit groups of OEs of DAC 440, represented as OEs 444 and OEs 446. In one embodiment, the notion of separate control signals and DWA loops, and separate output elements of the DAC is merely conceptual, and the practical application involves a single control signal and a single set of output elements, but rather than having a single sub-section of those elements switching with each transition, there are two sub-sections of the elements switching on each output transition. In one embodiment, two independent DACs with added or tied output signals, or output signals combined in an analog output filter, are controlled by a single physical control signal 520 having separate portions controlled as DWA loops 435 and 436.

Observe that control signal 520 is [0011000011001111] in binary, which can be treated as two separate control signals, [00110000] and [11001111] to control DAC OEs 444 and DAC OEs 446 separately, respectively. Each separate group of DAC OEs 444 and 446 is illustrated with a separate logical pointer, DWA pointer (ptr) 542 and DWA pointer 544, respectively. The pointers represent the function of tracking where the next non-activated output element is located after the output elements activated for a given sample. Thus, according to control signal 520 for the given output sample generated by DAC 440, the zeroeth and first elements of DAC OEs 444 are deactivated, and the second and third elements are activated. Thus, DWA pointer 542 points to the fourth element, because it is the next element after the block of activated output elements. In a similar manner, DWA pointer 544 points to the second element of DAC OEs 446, indicating the next available or deactivated element after the activated elements. Another way to think of the function of DWA pointers 542 and 544 is to consider them to point to the deactivated element of the group of output elements that is adjacent and to the right of an activated element. It will be understood that "to the right" is used conceptually, and refers to the notion of output elements being activated from left to right. Thus, the pointers point to the deactivated element that is adjacent to the block of activated elements and it to be activated subsequent to the deactivation of one or more of the activated elements.

Note that control signal 520 and the output pattern of DAC OEs 444-446 correspond to an input data word of a numeric value of 4. Two of the output elements to represent the value four are activated in DAC OEs 444 by bits in the portion of control signal 520 controlled by DWA loop 435, and the other two output elements are activated in DAC OEs 446 by bits in the portion of control signal 520 controlled by DWA loop 436. DWA loop 436 also includes four offset bits according to one embodiment of the invention.

Figure 6:
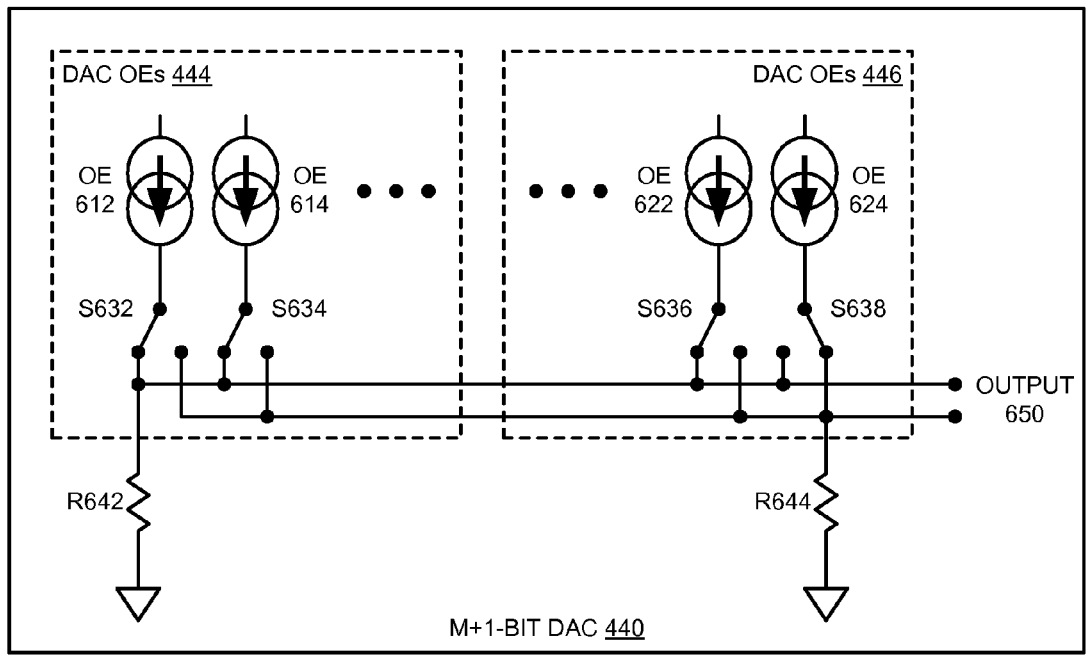
FIG. 6 is a block diagram of an embodiment of output elements of a DAC that is controlled by a DAC control signal.

FIG. 6 is a block diagram of an embodiment of output elements of a DAC that is controlled by a DAC control signal. M+1 bit DAC 440 (hereafter "DAC 440") represents an output stage of a DAC controlled according to a dual DWA loop technique as described herein. The DAC of FIG. 6 is a current-mode circuit, where each of the output elements (OEs) 612-614 and 622-624 is a current source. Note that the output elements could alternatively be capacitors or other circuit elements. Each OE 612-614 and 622-624 is coupled to a power supply (not shown), and is switched between the positive and negative output lines of different output 650. Output 650 corresponds to output 442 of FIG. 4. The charge, current, or voltage from each OE is summed together with the output of the other OEs on the same output line (i.e., the differential output line to which each of the OEs are connected via switches S632-S638) to generate the analog output. The OEs may have differences that negatively affect the linearity of the DAC due to random process mismatch as well as systematic errors and/or process gradients. A dynamic element matching stage of the DAC system produces a control signal, such as DEM 430 of FIG. 5, to control the OEs with a dual DWA loop technique.

Switches S632-S638 selectively couple each OE 612-614 and 622-624, respectively, to an output line in accordance with the control signal received from the DWA loop controlling the OEs. That is, OEs 444 are controlled by one DWA loop, and OEs 446 are controlled by a separate DWA loop. Each switch S632-S638 is independently controlled. Output resistors R642 and R644 are optional, and would convert the output current to an output voltage in implementations where they are used.

The inputs to DAC 440 can range from 0 to $2^M-1$ in a midrise DAC, or 0 to $2^M$ in a midtread DAC. Consider for DAC 440 that a state of operation is desired in which there is zero differential output current or voltage at output 650. Such a state can only be realized if there is an even number of OEs 444 and 446 to allow one half of the output current to flow to each output line. Thus, DAC 440 can be designed with an even number of output elements (i.e., the number of OEs 444 plus the number of OEs 446 is even). Additionally, there is a benefit to the logic design when the total number of output elements is a power of two (generally 8 or 16 output elements). Implementing the design of DAC 440 with 16 output elements provides the ability to have 9 output elements available if the maximum input of 7 is entered. With 9 available output elements to be switched on at the next input, the turn-on transient is linearly related to the output voltage at all times given that the number of output elements available to switch is greater than the maximum input.

As suggested previously, OEs 444 and 446 could be a single set or physical group of output elements, and may even be controlled by common control logic (e.g., a single output element controller controls all output elements, regardless of the DWA loop to which the output element belongs). Alternatively, DAC 440 could have separate control logic for two sets of output elements (444 and 446), which could be understood to cause the DWA loops to be two physically separate loops. Where a single physical set of output elements is managed by two separate DWA loops, the control signal can be considered to independently manage the OEs (444 and 446) with DWA loops as separate logic loops.

Figure 8:
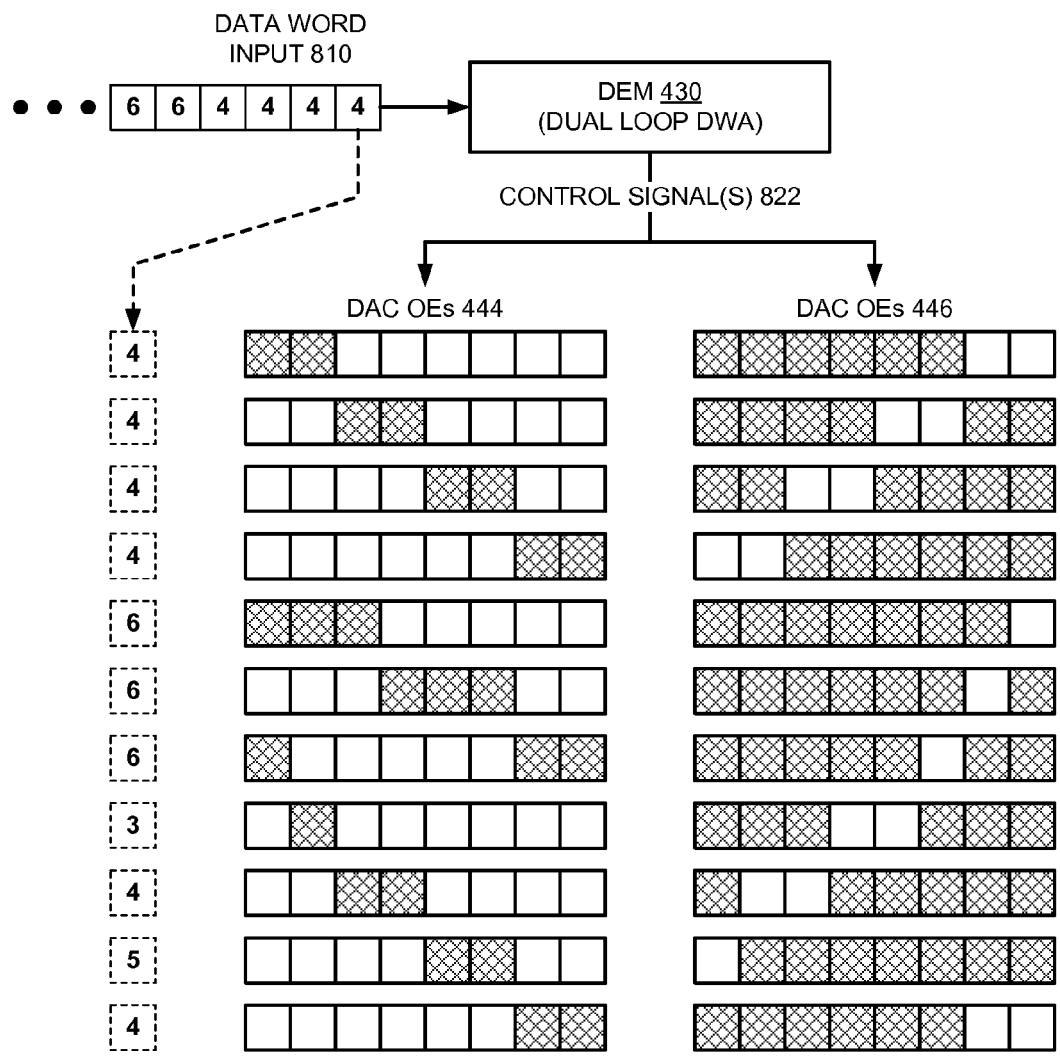
FIG. 8 is a symbolic representation of an embodiment of a DAC output based on a dual-loop data weighted averaging DAC control signal for a given input data word.

FIG. 8 is a block diagram of an embodiment of a DAC output based on a dual-loop data weighted averaging DAC control signal for a given input data word. Data word input 810 represents a series of decimal numeric values of an input to be output in analog form. The data word input is generated through sampling a signal of interest, and an output generated for each sample. Thus, each row of the shaded and non-shaded boxes represents a DAC output state for a given sample. In general, each sample will correspond to a clock cycle. DAC OEs 444 and 446 represent groupings of output elements in a DAC controlled in accordance with a dual DWA loop technique as described herein, and as provided in control signal(s) 822. The dual DWA loop technique generates control signal(s) 822 control each grouping of OEs independently of the other grouping to generate the output states shown corresponding to values of data word input 810. Although independently controlled, there is a relationship and coordination between the output elements activated in each group. The output of activated elements of DAC OEs 444 added with the output of activated elements of DAC OEs 446 represent the total positive output, and the total deactivated elements among the two DAC element groups represent the zeros in the control signal. For the control signal, there are a number of ones generated to represent the numeric value of the input, and there are a number of zeros generated to represent the total number of output elements (in both loops) minus the numeric value of the input. As shown in the embodiment depicted in FIG. 8, a constant number of the zeros may be replaced by ones as an offset value, generally applied to one group of output elements. As shown, an offset value of four output elements is applied by control signal(s) 822 to DAC OEs 446. Such an offset value may serve to zero or center a differential input to a desired output potential.

Data word input 810 is received at DEM 430, which implements a dual loop DWA algorithm to generate control signal (s) 822. See FIGS. 4 and 5 for additional details on DEM 430. DEM 430 may generate a single control signal that is controlled as two separate control signals (e.g., a single buffer or FIFO that is separately controlled in the upper and lower halves of the buffer), or may be two separate control signals in separate buffers or FIFOs. Control signal(s) 822 triggers the activation of DAC OEs 444-446 that correspond to ones in the control signal(s), and triggers the deactivation of DAC OEs 444-446 that correspond to zeros in the control signal(s).

As shown, if data word input 810 is four [4], two elements of DAC OEs 444 are activated and two-plus-four (offset) are activated in DAC OEs 446. At the next sample when data word input 810 is still four [4], the two active output elements of DAC OEs 444 are deactivated, and two different output elements are activated. The activation of elements generally occurs from left to right in delta-sigma DWA controlled DACs, but could be controlled to operate non-conventionally from right to left, or in any other direction. In DAC OEs 446, the six active output elements are deactivated, and six different output elements are activated, beginning with the sixth output element of DAC OEs 446, wrapping back to the zero-eth output element, and activating up to the third output element. A similar patter repeats while the input in sampled at four for the subsequent two samples [4], [4].

When data word input 810 changes to six [6] (i.e., the sample of the signal of interest is six), the two active output elements in DAC OEs 444 from the previous input [4] are deactivated, and three different output elements are activated based on control signal 822. Note that five output elements remain available to turn on or activate at the next clock cycle. Seven output elements are activated in DAC OEs 446, with only one available to be activated at the next clock cycle. Thus, observe that as with the previous input value of four, four total output elements will turn on. Such a pattern holds true for all static even inputs, so that any static even input code causes $2^{M-1}$ output elements to turn off and $2^{M-1}$ different output elements to turn on. The $2^{M-1}$ pattern causes the clock feedthrough and other transient energy to be equal for all static even inputs rather than being signal dependent.

Observe that the number of output elements switching in DAC OEs 444 is equal to the input divided by two (neglecting the remainder for odd inputs), and increases with the input. The number of output elements switching in DAC OEs 446 is the number of zeros or "bubbles" in the loop, which is $2^{M-1}$ minus half of the input, which number decreases with the input. Therefore, for all static inputs, the number of output elements switching stays nearly constant. There is a slight exception to the pattern for odd inputs, as shown with the inputs of three [3] and five [5] in data word input 810. An odd input cannot be divided perfectly in half. Thus, in one embodiment, floor and ceiling functions are used. For all static odd inputs, $2^{M-1}-1$ output elements will be activated instead of $2^{M-1}$, causing a slight nonlinearity. Such a nonlinearity exists only at the level of the LSB, meaning the nonlinearity is very small. The slight nonlinearity does not create a bow in the DAC transfer curve, but rather averages out with time as the data input word changes. See FIG. 7 for additional details. Thus, any effects of the nonlinearity are at high frequencies (first order noise shaping).

Figure 7:
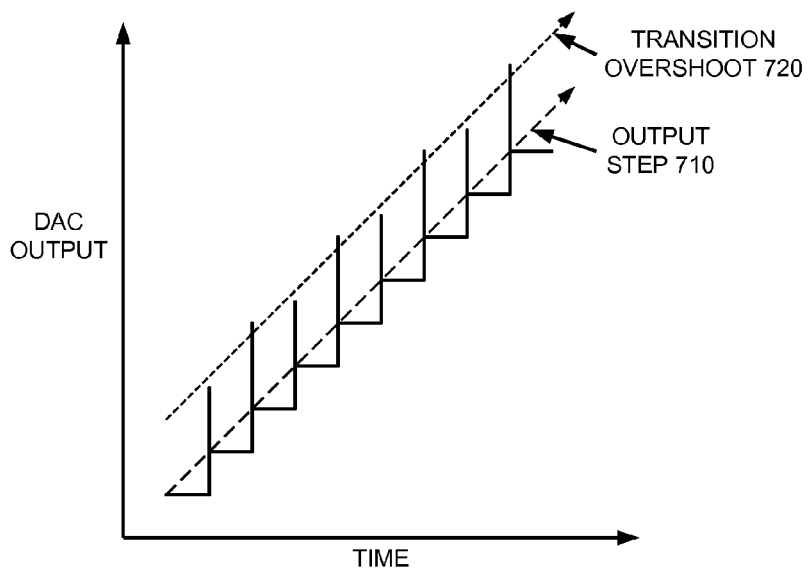
FIG. 7 is a representation of a time versus output graph illustrating the output step and transition overshoot for the dual DWA DAC system described herein.

FIG. 7 is a graphical representation of a time versus output relationship illustrating output step and transition overshoot for the dual DWA DAC system described herein. Output step 710 as a function of time for a ramp input to a DAC having $2*2^M$ output elements and employing a dual loop DWA technique is shown. The ramp input is a series of inputs whose initial input is zero, and whose value is incremented by one at each interval until the highest possible value is reached, at which time the ramp is concluded. Note that output step 710 is linear. Note that transition overshoot 720, is linear on average. The overshoot represented in FIG. 7 is exaggerated from what the actual overshoot may be, but is illustrative of the general performance. The overshoot is the same for all even input values, and is $2^{M-1}$ times the overshoot that would be present if only one unit element were switching. The overshoot is the same for all odd input values, and is $2^{M-1}-1$ times the overshoot that would be present if only one unit element were switching. For example, if the overshoot is fifty percent of the step size, and there are 8 unit elements (M=3), then the overshoot may be 1.5× for odd values, and 2× for even values, where x is the step size. Thus, while transition overshoot 720 may not appear to be very linear for systems with fewer output elements (e.g., M=3, corresponding to only 8 possible output values), transition overshoot 720 appears linear for systems having more output elements (e.g., M=8, corresponding to 256 possible output values). For higher values of M, the resulting distortion is small, and creates harmonics of a high enough frequency that the output filter removes them. Particularly, the harmonic is created at $2^{M-1}$ times the signal frequency.

Figure 9:
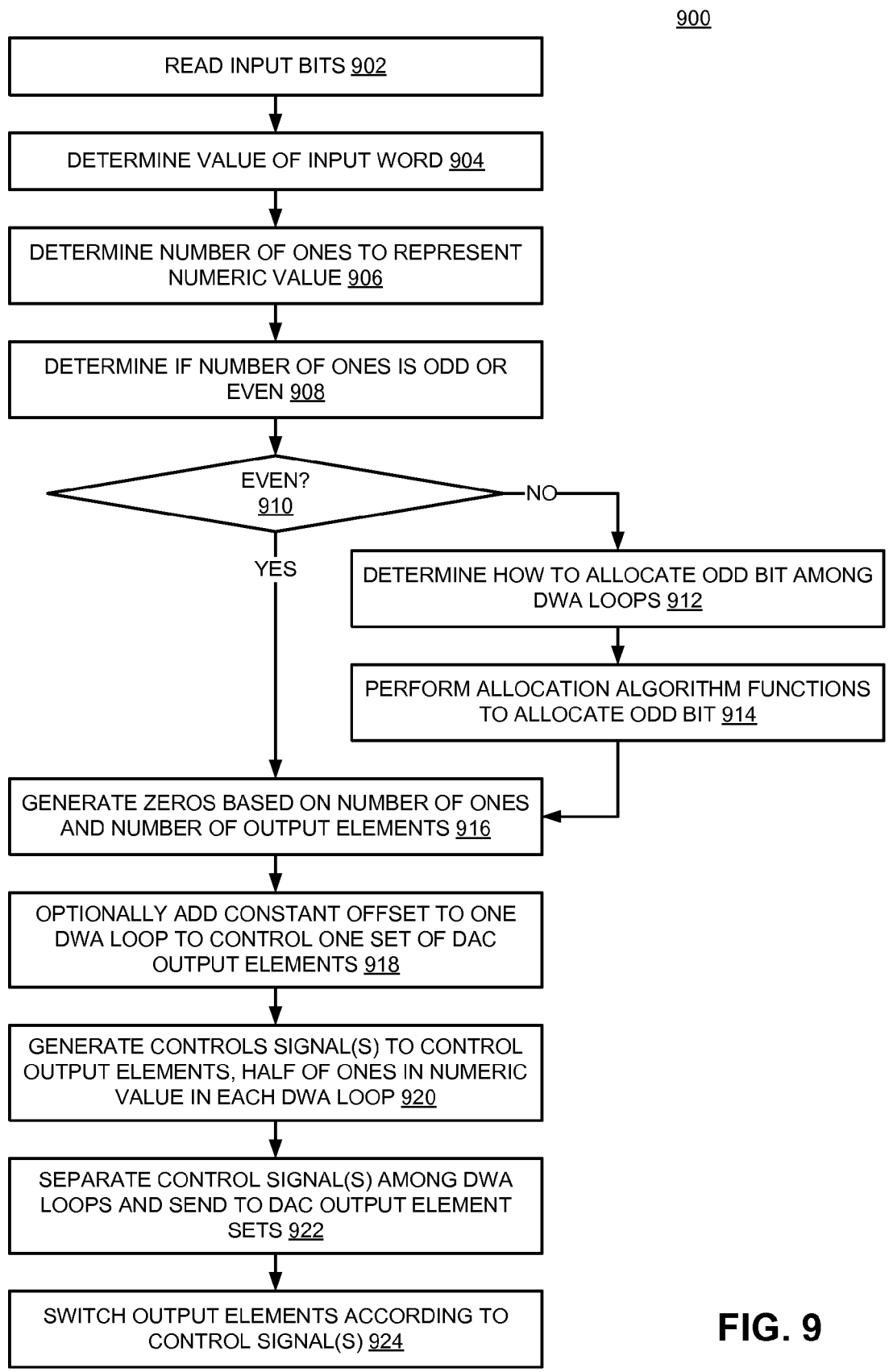
FIG. 9 is a flow diagram of an embodiment of a process for generating a DAC output based a dual-loop data weighting averaging DAC control signal.

FIG. 9 is a flow diagram of an embodiment of a process for generating a DAC output based a dual-loop data weighting averaging DAC control signal. Flow diagram 900 as illustrated herein provides an example of sequences of various process or method actions/operations. Although shown in a particular sequence or order, unless otherwise specified, the order of the actions can be modified. Thus, the illustrated implementations should be understood only as an example, and the process for establishing the secure channel can be performed in a different order, and some actions may be performed in parallel. Additionally, one or more actions can be omitted in various embodiments of the invention; thus, not all actions are required in every implementation. Other process flows are possible.

A DAC system reads input bits of an input data word, 902. The system determines the value of the input word, 904. Determining the value of the input word is generally performed by a dynamic element matching (DEM) unit that prepares a control signal to trigger the output elements of a DAC to generate the desired output. The DEM determines a number of ones to represent the numeric value, 906. Generally, representing the numeric value of the input word involves setting high, activating, or setting to an active state a number of output elements equal to the numeric value (thus, activate four output elements for an input having a numeric value of four).

In one embodiment, the DEM determines if the number of ones to represent the input word is odd or even, 908. In one embodiment, the same procedure for generating the control signal is the same regardless of whether the input is odd or even. However, an implementation could be made where there is a different procedure depending on whether the input is odd or even. If the input is not even, 910, meaning it is odd, the DEM may determine how to allocate the odd bit among the DWA loops, 912. There may be a number of ways to allocate the odd bit. For example, the bit could always be allocated to one of the DWA loops, or it could be switched between the loops. There is simplicity in always allocating the odd bit to the same loop. In an implementation where every possible effort is to be made to reduce nonlinearity, it may be justified to implement slightly more complex logic to distribute the odd bit evenly among the DWA loops. In other implementations, the net benefit may not outweigh the design and implementation costs. Whether with a simple or more elaborate method, the DEM performs the selected allocation algorithm functions to allocate the odd bit, 914. One simple implementation involves the use of a floor function for one loop and a ceiling function for the other loop. Thus, the extra bit will automatically be allocated to the loop for which the ceiling function is performed.

If the input is even, 910, or after allocating the odd bit, 912-914, the DEM generates a number of zeros based on, or as a function of, the number of ones and the number of output elements in the DAC controlled by the DEM control signal(s), 916. For example, a number of zeroes could be generated equal to the number of output elements minus the numeric value of the input. The number of zeros could be adjusted if a constant offset is optionally added to one of the DWA loops, 918. The DEM then generates one or more control signals to control the output elements of the DAC, with half of the ones representing the input distributed to each DWA loop, 920. In one embodiment, distributing half of the ones will not include the case where a constant offset is added, in which case only the ones representing the input are split among the loops, and the offset is provided entirely to a single loop.

The control signal(s) are separated among the output elements of one or more DAC(s) controlled by the DWA loops, 922. The DAC then switches on and off output elements according to the received control signal(s), 924. The result is the desired analog output at the output of the DAC.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium may cause a machine to perform the functions or operations described, and includes any mechanism that provides (i.e., stores and/or transmits) information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for converting a digital value into an analog value comprising:
   receiving an M-bit data word representing a numeric value between 0 and $2^M-1$;
   generating a control signal representing two data weighted averaging (DWA) loops, each DWA loop to separately control output elements of a digital-to-analog converter (DAC) to output the M-bit data word in analog form, each DWA loop to control $2^M$ output elements, the control signal having a number of ones representing the numeric value, wherein generating the control signal includes
      generating in a first DWA loop a number of bits representing one half the number of ones to activate one half of the number of ones in the output elements controlled by the first DWA loop; and
      generating in the second DWA loop a number of bits representing one half the number of ones to activate one half of the number of ones in the output elements controlled by the second DWA loop.

2. The method of claim 1, wherein generating the control signal further comprises:
   generating a control signal having a number $2^{M+1}$ minus the numeric value of zeros.

3. The method of claim 1, wherein generating the control signal further comprises:
   determining how to allocate an odd bit among the first and second DWA loops for an odd numeric value of the data word.

4. The method of claim 3, wherein determining how to allocate the odd bit for the odd numeric value comprises:
   dividing the numeric value by two to produce an adjusted numeric value;
   performing a floor function on the adjusted numeric value to generate a first control value equal to half the number of ones ignoring the remainder;
   performing a ceiling function on the adjusted numeric value to generate a second control value equal to half the number of ones plus an additional one to represent the remainder; and
   generating in one of the two DWA loops a control signal equal to the first control value and generating in the other DWA loop a control signal equal to the second control value.

5. The method of claim 1, wherein generating in the second DWA loop the number of bits to activate one half of the number of ones in the output elements further comprises:
   generating in the second DWA loop a number of bits to activate one half the number of ones plus a constant in the output elements.

6. The method of claim 5, wherein generating in the second DWA loop a number of bits to activate one half the number of ones plus the constant comprises:
   generating in the second DWA loop a number of bits to activate one half the number of ones plus $2^{M-1}$ additional ones in the output elements.

7. A digital to analog converter (DAC) system comprising:
   a DAC having two groups of $2^M$ output elements, each group of output elements to be controlled by a data weighted averaging (DWA) loop, the sum of the two groups of output elements to provide an analog output for the DAC, the output elements of the two groups to be activated and deactivated in accordance with DWA control signals; and
   a dynamic element matching unit (DEM) to generate the DWA control signals and send the DWA control signals to the DAC to activate and deactivate the output elements to provide the analog output, wherein generating the DWA control signals includes the DEM to allocate a number of ones equal to one half of a number of ones needed to represent an M-bit data word having a numeric value between 0 and $2^M-1$ to each DWA control signal.

8. The DAC system of claim 7, wherein the DEM is to further determine how to allocate an odd bit among the DWA control signals for an odd numeric value of the M-bit data word.

9. The DAC system of claim 8, wherein the DEM is to further:
   divide the numeric value by two to produce an adjusted numeric value;
   perform a floor function on the adjusted numeric value to generate a first control value equal to half the number of ones ignoring the remainder;
   perform a ceiling function on the adjusted numeric value to generate a second control value equal to half the number of ones plus an additional one to represent the remainder; and
   generate one DWA control signal to represent the first control value, and generate the other DWA control signal to represent the second control value, to determine how to allocate the odd bit.

10. The DAC system of claim 7, wherein the DEM is to further allocate a number of zeros equal to $2^{M+1}$ minus the numeric value to each DWA control signal.

11. The DAC system of claim 10, wherein the DEM is to adjust one of the DWA control signals by including a number of ones in the DWA control signal equal to a constant.

12. The DAC system of claim 11, wherein the constant equals $2^{M-1}$.

13. The DAC system of claim 7, wherein the DEM further comprises:
   first-in, first-out (FIFO) buffers representing the DWA loops to hold the DWA control signals.

14. The DAC system of claim 13, wherein the FIFO buffers comprise a single physical FIFO buffer that is logically operated as two independent FIFO buffers to achieve the two DWA loops.

15. The DAC system of claim 7, wherein the two groups of output elements of the DAC comprise a single physical set of output elements having common control logic, where the single physical set of output elements is managed as two independent DACs in accordance with the two DWA loops.

16. A method comprising:

accessing a communication interface; and providing a data signal on the communication interface having data describing:

a DAC having two groups of $2^M$ output elements, each group of output elements to be controlled by a data weighted averaging (DWA) loop, the sum of the two groups of output elements to provide an analog output for the DAC, the output elements of the two groups to be activated and deactivated in accordance with DWA loop control signals; and a dynamic element matching unit (DEM) to generate the DWA control signals and send the DWA control signals to the DAC to activate and deactivate the output elements to provide the analog output, wherein generating the DWA control signals includes the DEM to allocate a number of ones equal to one half of a number of ones needed to represent an M-bit data word having a numeric value between 0 and $2^M-1$ to each DWA control signal.

17. The method of claim 16, wherein providing the signal having data describing the DEM further comprises:

providing the data signal having data describing the DEM to further determine how to allocate an odd bit among the DWA control signals for an odd numeric value of the M-bit data word.

18. The method of claim 17, wherein providing the data signal having data describing the DEM to determine how to allocate the odd bit comprises providing the signal having data describing the DEM to further:

divide the numeric value by two to produce an adjusted numeric value;

perform a floor function on the adjusted numeric value to generate a first control value equal to half the number of ones ignoring the remainder;

perform a ceiling function on the adjusted numeric value to generate a second control value equal to half the number of ones plus an additional one to represent the remainder; and generate one DWA control signal to represent the first control value, and generate the other DWA control signal to represent the second control value.

19. The method of claim 16, wherein providing the data signal having data describing the DEM comprises providing the data signal having data describing the DEM to adjust one of the DWA control signals by including a constant number of ones in the DWA control signal.

20. The method of claim 19, wherein the constant equals $2^{M-1}$.

21. A method for digital to analog conversion comprising:

receiving an M-bit data word representing a numeric value between 0 and $2^M-1$; and generating a control signal representing multiple weighted averaging (DWA) loops, each DWA loop to separately control output elements of a digital-to-analog converter (DAC) to output the M-bit data word in analog form, each DWA loop to control a portion of the output elements, the control signal including a number of ones to represent the numeric value;

wherein generating the control signal includes generating in each DWA loop a number of ones to activate a corresponding number of output elements controlled by the respective DWA loop, the number of ones generated in each DWA loop being zero or more, where the total number of ones generated in all DWA loops combined includes a number to represent the numeric value.

* * * * *